(12) United States Patent
Nishiyama et al.

(10) Patent No.: US 7,105,459 B2
(45) Date of Patent: *Sep. 12, 2006

(54) METHOD FOR FORMING THIN FILM (75) Inventors: Norikazu Nishiyama, Toyonaka (JP);
Yoshiaki Oku, Kyoto (JP); Shunsuke Tanaka, Toyonaka (JP); Korekazu Ueyama, Takarazuka (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/506,730

(22) PCT Filed: Mar. 3, 2003

(86) PCT No.: PCT/JP03/02433

§ 371 (c)(1),
(2), (4) Date: Sep. 3, 2004

(87) PCT Pub. No.: WO03/075335

PCT Pub. Date: Sep. 12, 2003

(65) Prior Publication Data

US 2005/0106802 A1 May 19, 2005

(30) Foreign Application Priority Data

Mar. 4, 2002 (JP) .............................. 2002-057855

(51) Int. Cl.
*H01L 21/31* (2006.01)

(52) U.S. Cl. ...................................... 438/765; 438/778

(58) Field of Classification Search .................... None
See application file for complete search history.

(56) References Cited

U.S. PATENT DOCUMENTS

| 6,573,131 B1* | 6/2003 | Yan et al. ................... 438/207 |
| 2005/0003678 A1* | 1/2005 | Nishiyama et al. ......... 438/765 |

FOREIGN PATENT DOCUMENTS

| EP | 1 094 506 A2 | 4/2001 |
| JP | 2002-217190 | 8/2002 |
| JP | 2002-293529 | 10/2002 |
| WO | 01/75957 A1 | 10/2001 |
| WO | 03/003440 A1 | 1/2003 |

* cited by examiner

*Primary Examiner*—Dung A. Le
(74) *Attorney, Agent, or Firm*—Hamre, Schumann, Mueller & Larson, P.C.

(57) ABSTRACT

It is an object to provide, with a high productivity, a dielectric thin film having a high degree of pore and a very great mechanical strength, and there are included a surfactant film forming step of forming a film including a surfactant on a surface of a substrate on which a thin film is to be formed, a vapor deposition step of causing the substrate to come in contact with a gas phase containing a silica derivative to form a thin film including the silica derivative, and a step of calcining the substrate having the thin film formed thereon and decomposing and removing the surfactant, the thin film being thus formed.

8 Claims, 11 Drawing Sheets

METHOD FOR FORMING THIN FILM

TECHNICAL FIELD

The present invention relates to a thin film forming methods and more particularly to a thin film forming method using vapor deposition.

BACKGROUND ART

A reduction in the dielectric constant or an interlayer dielectric film is an important problem for an increase in a speed and a reduction in a consumed power in a semiconductor device. Various devises have been made in order to reduce the dielectric constant. For a conventional semiconductor device, there have been proposed methods of:

(1) adding fluorine to a silica film to be an inorganic insulating film;
(2) forming an organic insulating material having a low dielectric constant as a parent material; and
(3) intentionally forming a porous film.

In the case of the method (1), however, the moisture resistance of the insulating film is deteriorated. For this reason, the fluorine can be added in an element ratio or several % at most. Therefore, there is a problem in that a dielectric constant can be reduced by 10% to 15% at most as compared with a conventional silica type interlayer dielectric film.

In the case of the method (2), moreover, there is a problem in that a heat resistance and a mechanical strength are reduced more considerably than those of the conventional silica type interlayer dielectric film because of the organic material, resulting in a deterioration in the reliability of a semiconductor device.

In the case or the method (3), furthermore, the mechanical strength of the interlayer dielectric film is remarkably reduced because a porous structure is random, and there is no CMP (chemical mechanical polishing) resistance. For this reason, the film is apt to be broken in packaging, causing a deterioration in the reliability of the semiconductor device.

In many cases, moreover, the porous structure is not closed. If the porous structure is not closed, the moisture resistance of the interlayer dielectric film is remarkably reduced, resulting in a deterioration in the reliability of the semiconductor device.

In the conventional insulating film, thus, there is a problem in that the dielectric constant cannot be reduced sufficiently, and furthermore, a sufficient mechanical strength cannot be obtained.

Therefore, the inventors have proposed a method of forming a pure mesoporous silica thin film by dissolving, in a solvent, a surfactant, a silica derivative and an acid catalyst in a desirable mole ratio, preparing a precursor solution in a mixing vessel, applying the precursor solution thus prepared onto a substrate, polymerizing the silica derivative through hydrolysis (polycondensation reaction) (a precrosslinking step), forming a mesoporous silica thin film including a cavity having, as a template, the periodic self-assembly or the surfactant, and thermally decomposing and removing the surfactant of the template completely at a calcining step.

At this time, the substrate is exposed to a silica derivative atmosphere and is heated with the supply of the silica derivative prior to the calcining. Consequently, the shrinkage of the film is prevented from being caused by the hydrolysis, and the cavity is not broken but maintained as it is so that a mesoporous silica thin film having, as a template, the rigid self-assembly of the surfactant is obtained. Furthermore, the surfactant of the template is thermally decomposed and removed completely at the calcining step so that a pure mesoporous silica thin film is obtained.

Thus, it is possible to provide a dielectric thin film having a very excellent controllability, a great mechanical strength and a very low dielectric constant.

However, the strength and the dielectric constant are not sufficient and a further enhancement in characteristics has been required.

DISCLOSURE OF THE INVENTION

The invention has been made in consideration of the actual circumstances and has an object to provide, with a high controllability, a thin film which can easily be manufactured and has a high degree of pore and a great mechanical strength.

Moreover, it is an object of the invention to provide, with a high controllability, a dielectric thin film having a very low dielectric constant and a very great mechanical strength.

Therefore, a method according to the invention comprises a surfactant film forming step or forming a film including a surfactant on a surface of a substrate on which a thin film having a low dielectric constant is to be formed, a vapor deposition step of causing the substrate to come in contact with a gas phase containing a silica derivative to form a thin film including the silica derivative, and a step of calcining the substrate having the thin film formed thereon and decomposing and removing the surfactant, a dielectric thin film being thus formed.

According to such a method, the step of foaming a thin film including a silica derivative is executed at the vapor deposition step. As compared with the case of a coating method (a temperature in the preparation of a precursor solution for coating is 90° C. at most), therefore, a growth can be carried out at a higher temperature (for example, 180° C.). Accordingly, a degree of crosslinking is increased so that a network can be enhanced and a bonding strength is increased in a wall portion. At the calcining step, accordingly, it is possible to form a thin film having a low dielectric constant which has a structure changed with difficulty, is stable, and has a great mechanical strength and a high degree of pore.

Moreover, the formation can be carried out even if a temperature in the calcining is comparatively low, that is, approximately 300° C. to 400° C. Also in the case in which the thin film is used as the interlayer dielectric film of an integrating circuit, therefore, it is possible to form an insulating film having a high reliability without influencing a substrate. By using a reduced pressure CVD method as the vapor deposition step, it is possible to form a uniform film.

A substrate temperature of 100° C. or more is suitable for a growth temperature, and 180° C. or more is more suitable. A distance between the planes (hereafter referred as "d-space") of a periodic structure is large in a growth at 100° C., and is small at 180° C.

When it is assumed that a pore diameter is constant, a silica wall thickness is smaller and a porosity is higher at 180° C. than those at 100° C. Moreover, there is a problem in that the surfactant is thermally decomposed at approximately 250° C. or more.

In the case in which the growth is carried out at a high temperature of approximately 180° C., the d-space is decreased. It can be supposed that a reaction is immediately ended and the thickness of a silica wall film is decreased because TEOS (tetraethoxy silane) molecules quickly react to each other.

On the other hand, in the case in which the growth is carried out at a low temperature of approximately 100° C., the d-space is increased. It can be supposed that the thickness of the silica wall film is increased because the TEOS molecules slowly react to each other.

At the temperature in the vapor deposition, accordingly, it is possible to provide the different porosities (dielectric constants) of the same material.

Moreover, it is possible to properly change the porosity by adjusting the composition of a vapor phase. For example, it is possible to form a dielectric thin film having a great different characteristic depending on the presence of a catalyst. $NH_3$ or $NH_4OH$ is currently used as the catalyst. In the case in which the catalyst is not used, the reaction rate of the TEOS molecule is low and the thickness of the silica wall is increased so that a pore space is increased. The $NH_3$ is used as the catalyst because HCl corrodes a stainless vessel or a chamber.

On the other hand, it can be supposed that the reaction rate of the TEOS molecule is low and the thickness of the silica wall is increased so that the d-space is increased also in the case in which a pressure is lowered.

In the case in which the catalyst is not added, moreover, a coating solution is inactive because the coating solution is composed of either surfactant or solvent, such as water and ethanol, whereby a bottle life of the solution is extremely prolonged.

Moreover, it is possible to control the thickness of a surfactant film by adjusting the concentration of a surfactant (CTAB)/solvent which is formed prior to the vapor deposition and the rotation speed in coating. By adjusting a vapor phase, furthermore, it is possible to carry out the preparation described above. Therefore, a degree of freedom in the film formation can be increased greatly.

According to the invention, thus, it is possible to greatly control a porosity, a dielectric constant, a strength and a moisture resistance by the control of the vapor phase (TEOS atmosphere) in addition to the catalyst and coating conditions. Consequently, it is possible to form a desirable insulating thin film with a very great workability.

Thus, an inorganic insulating film having a porosity of 50% or more is formed and air has a low dielectric constant. Therefore, it is possible to further reduce the dielectric constant as compared with the addition of fluorine. Thus, it is possible to extremely reduce the dielectric constant of the insulating film.

It is possible to maintain a much greater mechanical strength than that of conventional porous silica and to decrease the dielectric constant.

Moreover, it is possible to enhance a moisture resistance and a chemical resistance and to form a thin film having a uniform low dielectric constant.

Accordingly, it is possible to obtain a sharp pattern in the formation of a through hole by etching and patterning.

Furthermore, it is possible to maintain the strength at an ashing step after the etching.

It is desirable that the vapor deposition step serves to form a thin film including a silica derivative having a siloxane skeleton (particularly, a cyclic siloxane skeleton, furthermore, a siloxane skeleton having a four-membered ring or more) and a surfactant and including a silica derivative having a pore arranged periodically. At the vapor deposition step, alternatively, there is formed a thin film including a silica derivative having a cavity such as HSQ (silsesquioxane hydride) or MSQ (methyl silsesquioxane) and a surfactant and including a silica derivative having a pore arranged periodically. Moreover, it is also possible to use clathrasil.

According to such a method, it is possible to form a mesoporous silica thin film at a higher temperature as compared with a thin film having a low dielectric constant which is formed by a conventional coating method or dipping method. Therefore, a mechanical strength can be enhanced, and furthermore, a thin film having a lower dielectric constant can be formed. By using a silica derivative having a cyclic siloxane skeleton, moreover, it is possible to provide a small pore also in a silica wall film. Furthermore, the porosity is increased so that the dielectric constant can be more reduced. It is more desirable to use a silica derivative including a siloxane skeleton having a six-membered ring or more.

It is desirable that the surfactant film forming step is a coating step of coating a solution containing a surfactant.

According to such a structure, it is possible to form a film simply and easily.

It is desirable that the coating step should be a spin coating step.

According to such a structure, it is possible to form a uniform surfactant film. By adjusting the viscosity of a coating solution, and the rotation speed of a spinner and the concentration and viscosity of the surfactant, moreover, it is possible to easily control the thickness of the film.

It is desirable that the surfactant film forming step should be an immersing step of carrying out an immersion in a solution containing the surfactant.

According to such a structure, it is possible to carry out a batch process, thereby forming a film having a very high productivity.

It is desirable that the vapor deposition step should be executed at a substrate temperature of 100° C. or more, and more preferably, 180° C. or more.

According to such a structure, the growth can be carried out at a higher temperature (for example, 180° C.) as compared with the case of a coating method for forming a film at a room temperature. Since a degree of crosslinking is increased, accordingly, a bonding strength is increased.

The growth temperature can be set to be 100° C. or more, and furthermore, 180° C. or more. In the case of the growth at 100° C., the d-space of the periodic structure is great.

if it is assumed that the bore diameter is constant, the thickness of the silica wall is greater and the porosity is higher at 180° C. than 100° C. Moreover, there is a problem in that the surfactant is thermally decomposed at approximately 250° C. or more.

Accordingly, the mechanical strength is increased. Since the shrinkage is not carried out in the calcining, moreover, a film can be formed stably with a low film stress and the dielectric constant can be controlled easily. In addition, the strength of the film can be increased so that it is possible to form a dielectric film having a high moisture resistance, a small film stress and an excellent adhesion to a substrate.

The calcining step is desirably executed at 300° C. to 500° C., and more desirably, 300° C. to 400° C. or more.

According to such a structure, an OH group is not incorporated and an application to a semiconductor device is effective. Moreover, the TEOS molecules are completely crosslinked before the surfactant is removed. Therefore, a film can be formed at 400° C. or less.

It is desirable that the method should comprise a surfactant film forming step of coating and forming a film containing a surfactant and a catalyst on a surface of a Semiconductor substrate on which a desirable device region is formed, a vapor deposition step of forming a silica derivative thin film by an exposure to a TEOS atmosphere while maintaining the semiconductor substrate at a desirable set temperature, and a step of calcining the substrate having the thin film formed thereon and decomposing and removing the surfactant, a dielectric thin film being thus formed. It is desirable that the TEOS atmosphere should be set into a saturated vapor of TEOS.

According to such a structure, a dielectric thin film having a high reliability is formed.

It is possible to form an excellent dielectric thin film depending on conditions even if the film is formed without the addition of a catalyst.

It is desirable that the thin film should have a porosity of 50% or more.

It is desirable that the thin film should be an inorganic dielectric thin film having a porosity or 50% or more.

According to such a structure, the thin film is formed on the surface or the substrate and the pore has an orientation.

It is desirable that the thin film should have a periodic porous structure including a cylindrical pore oriented in parallel with the surface of the substrate.

It is desirable that the thin film should have a periodic porous structure including a layered pore oriented in parallel with the surface of the substrate.

It is desirable that the thin film should have such a periodic porous structure as to have a different orientation for each domain, for example, in which a layered pore or a cylindrical pore is oriented in parallel with the surface of the substrate or they are mixed for each domain.

Moreover, it is apparent that the structure thus obtained is changed according to a ratio of the surfactant to the silica derivative.

Figure 11:
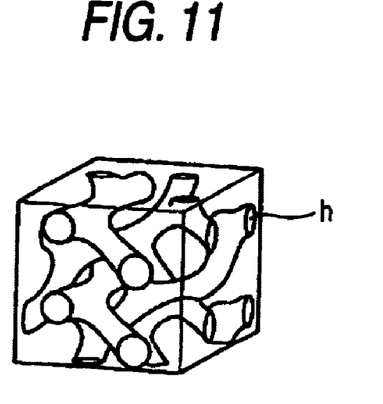
FIG. 11 is a view showing a variant of the structure of a dielectric thin film obtained in the invention.

For example, it has been found that a pore h has a three-dimensional network structure (cubic) as shown in FIG. 11 when the molar ratio of the surfactant to the silica derivative such as CTAB/TEOS if set within a predetermined range. When the molar ratio is lower than this range, there is formed a thin film having a low dielectric constant in which a cylindrical pore is oriented. On the other hand, when the molar ratio is higher than this range, there is formed a dielectric thin film having a low dielectric constant in which a layered pore is oriented.

Moreover, the thin film has a periodic porous structure having the skeleton of a honeycomb structure on the surface of the substrate.

According to such a structure, when the surfactant of the template is to be thermally decomposed and removed at the calcining step, there is used the reaction of the silica derivative at a higher temperature than a room temperature in a spin coating method or a dipping method or 90° C. in a hydrothermal synthesis method. Consequently, it is possible to obtain a strong and pure mesoporous silica thin film in which a mechanical strength is great and a structure is prevented from being broken.

Herein, the in-plane d-space implies a repetition device in a film thickness direction which is obtained by an X-ray diffraction method.

In the drawings, h denotes a pore, 1 denotes a silicon substrate, 2 denotes an isolating film, 3 denotes a gate insulating film, 4 denotes a gate electrode, 5 denotes a source region, 6 denotes a drain region, 7 denotes an insulating film, a denotes a contact hole, 9 denotes a lower electrode, 10 denotes a ferroelectric film, and 11 denotes an upper electrode.

BEST MODE FOR CARRYING OUT THE INVENTION

An embodiment of a method of manufacturing a semiconductor device according to the invention will be described in detail with reference to the drawings.

First Embodiment

As a first embodiment of the invention; description will be given to FeRAM in which a thin film having a low dielectric constant that is formed by using the method according to the invention is used as an interlayer dielectric film.

In a method of forming a thin film having a low dielectric constant according to the first embodiment of the invention, the surface of a substrate is spin coated with a surfactant solution and is then exposed to a TEOS vapor atmosphere, and a rigid silica derivative thin film having an excellent orientation it formed on the whole surfactant layer and is calcined so that a stable thin film having a great mechanical strength and a low dielectric constant is formed.

Figure 1:
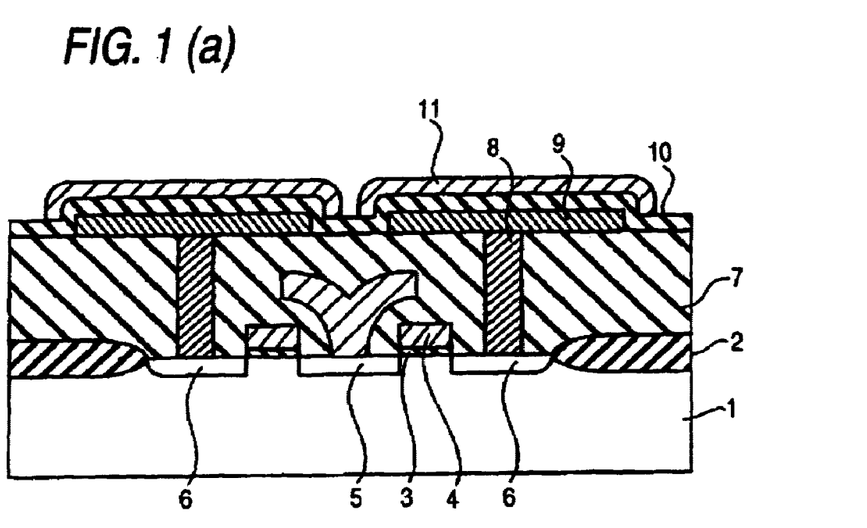
FIG. 1 is a view showing FRAM using a dielectric thin film formed by a method according to a first embodiment of the invention.

As shown in FIGS. 1(a) and (b), the FeRAM comprises a switching transistor formed in an element region surrounded by an isolating film 2 provided on the surface of a silicon substrate 1 and a ferroelectric capacitor, and the invention is characterized in that a thin film 7 formed by the method according to the invention is used as an interlayer dielectric film between the switching transistor and a lower electrode 9 of the ferroelectric capacitor. The thin film having a low dielectric constant is constituted by a mesoporous silica thin film formed to include a plurality of periodic porous structure domains including a cylindrical pore h oriented in one direction in parallel with the surface of the substrate as shown in an enlarged perspective view showing a main part in FIG. 1(b).

Others are formed by an ordinary method. The switching transistor includes a gate electrode formed on the surface of the silicon substrate 1 through a gate insulating film 3 and a source region 5 and a drain region 6 which are formed to interpose the gate electrode therebetween, and the lower electrode 9 is connected to the drain region 6 through a contact 8. On the other hand, the source and drain regions are connected to a bit line BL.

On the other hand, the ferroelectric capacitor is formed by interposing a ferroelectric thin film 10 formed of PZT between the lower electrode 9 and an upper electrode 11.

Description will be given to a process for manufacturing the FRAM with reference to FIGS. 2(a) to (d).

Figure 2:
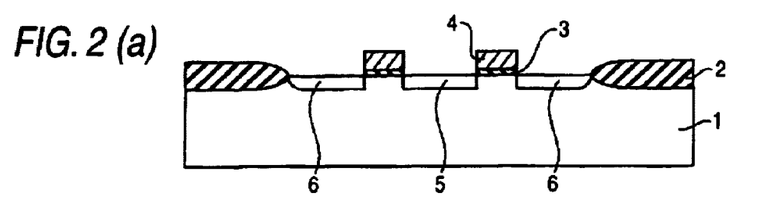
FIG. 2 is a view showing a process for manufacturing the FRAM in FIG. 1.

First of all, by an ordinary method, a gate electrode 4 is formed on the surface of the silicon substrate 1 through the gate insulating film 3, and an impurity diffusion is carried out by using the gate electrode as a mask, thereby forming the source region 5 and the drain region 6 (FIG. 2(a)).

By the method according to the invention, subsequently, a mesoporous silica thin film is formed in order to include a plurality of periodic porous structure domains having a cylindrical pore oriented in one direction in parallel with the surface of the substrate (FIG. 2(b)).

Figure 5:
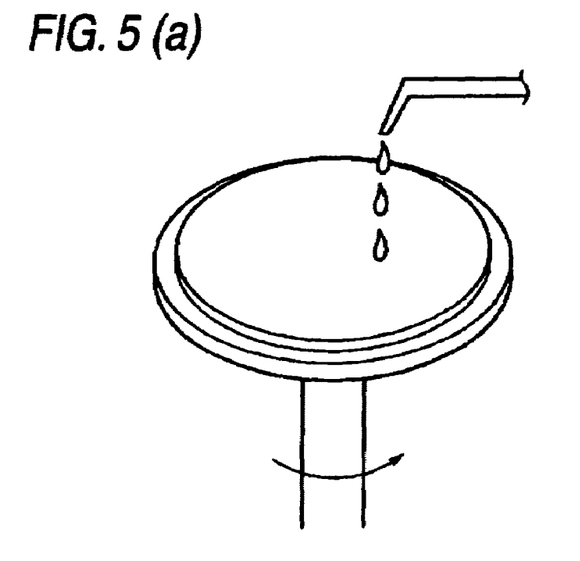
FIG. 5 is an explanatory view showing a process for forming a dielectric thin film according to a second embodiment of the invention.

More specifically, a spinner shown in FIG. 5 is used to carry out dropping onto the surface of the substrate 1 to be treated which is mounted on the spinner and to perform a rotation at 500 to 6000 rpm, thereby forming a coated film including a surfactant. In other words, first of all, cation type cetyltrimethyl ammonium bromide (CTAB:$C_{16}H_{33}N^+(CH_3)_3Br^-$) to be a surfactant and hydrochloric acid (HCl) to be an acid catalyst are dissolved in an $H_2O$/alcohol mixed solvent, and the surface of the substrate is coated with this mixture by means of the spinner, thereby forming a film containing the CTAB. Then, the film is dried at a room temperature so that a film having the surfactant oriented thereon is formed as shown in an explanatory view of FIG. 3(a). The catalyst is not restricted to the acid catalyst but a basic catalyst such as $NH_4OH$ can also be applied or catalyst-free is applicable.

Figure 3:
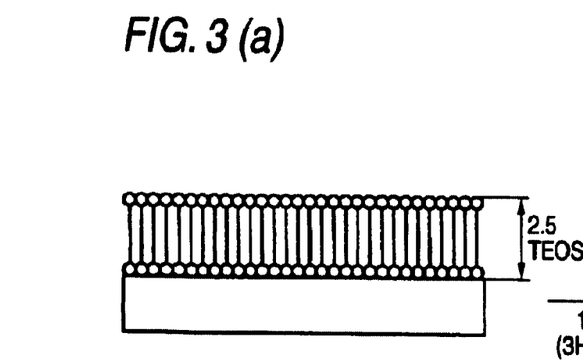
FIG. 3 is an explanatory view showing a process for forming a dielectric thin film according to the first embodiment of the invention.

Thereafter, the TEOS solution is present as a silica derivative in a chamber C, and the substrate 1 is attached and covering is carried out, and a temperature is raised to 180° C., thereby forming a silica derivative film having a cylindrical one-dimensional periodic structure in which the periodic self-assembly of the surfactant shown in FIG. 3(b) is set to be a template by vapor deposition. In some cases, an array state shown in FIG. 3(c) is brought depending on film forming conditions at this time.

Figure 4:
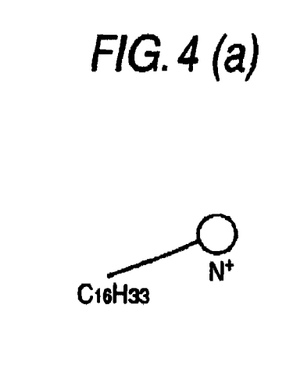
FIG. 4 is an explanatory view showing the dielectric thin film according to the first embodiment of the invention.

The self-assembly forms a spherical micelle structure (FIG. 4(b)) obtained by aggregating a plurality of molecules, each of which is $C_{16}H_{33}N^+(CH_3)_3Br^-$ (CTAB) as shown in FIG. 4(a), and a silica derivative thin film is foxed with an orientation along the spherical micelle structure skeleton.

Subsequently, the substrate 1 thus dried is heated and calcined for five hours in the air and the surfactant of the template is thermally decomposed and removed completely to form a pure mesoporous silica thin film as shown in FIG. 4(d). It is desirable that the heating and calcining should be carried out in an $O_2$ atmosphere. In the $O_2$ atmosphere, the calcining can be carried out at a lower temperature.

According to such a method, a structure having a great mechanical strength is formed. Also in the calcining, therefore, a cavity is not broken but maintained as it is (FIG. 4(d)).

For this reason, a cylinder (FIG. 4(d)) having a cylindrical pore oriented thereon is formed so that a thin film having a lower dielectric constant can be formed.

Consequently, it is apparent that the thin film having a low dielectric constant is formed by a porous thin film having a pore oriented thereon.

Thus, the thin film 7 having a low dielectric constant according to the embodiment of the intention is formed as shown in FIG. 2(b). Actually, the bit line BL is formed. For this reason, the thin film having a low dielectric constant is to be formed through two processes.

Then, the contact hole B is formed on the thin film 7 having a low dielectric constant by an ordinary method. Thereafter, a polycrystalline silicon layer doped in a high concentration in the contact hole is buried to form a plug, and subsequently, iridium is used as a target to form an iridium oxide layer by using a mixed gas of argon and oxygen. Furthermore, a platinum layer is formed on the iridium oxide layer by using platinum as a target. As shown in FIG. 2(c), thus, an iridium oxide layer having a thickness of approximately 50 nm and a platinum layer having a thickness of approximately 200 nm are formed and are subjected to patterning by photolithography, thereby forming the lower electrode 9.

Next, a PZT film is formed as the ferroelectric film 10 on the lower electrode 9 by a sol-gel method. A mixed solution of $Pb(CH_3COO)_2$—$3H_2O$, $Zr(t-OC_4H_9)_4$, $Ti(i-OC_3H_7)_4$ was used as a starting material. The mixed solution was spin coated and was then dried at 150° C., and temporary calcining was carried out for 30 minutes at 400° C. in a dry air atmosphere. This was repeated five times and a heat treatment was then carried out at 700° C. or more in an $O_2$ atmosphere. Thus, the ferroelectric film 10 having a thickness of 250 nm was formed. Herein, the PZT film is formed with x of 0.52 in $PbZr_xTi_{1-x}O_3$ (which will be hereinafter referred to as PZT(52/48)).

Furthermore, a laminated film of iridium oxide and iridium is formed on the ferroelectric film 10 by sputtering. The laminated film of the iridium oxide layer and the iridium layer is set to be the upper electrode 11. Herein, the iridium layer and the iridium oxide layer are formed to have a thickness of 200 nm together. Thus, a ferroelectric capacitor can be obtained so that the FRAM shown in FIG. 1 is formed.

Figure 8:
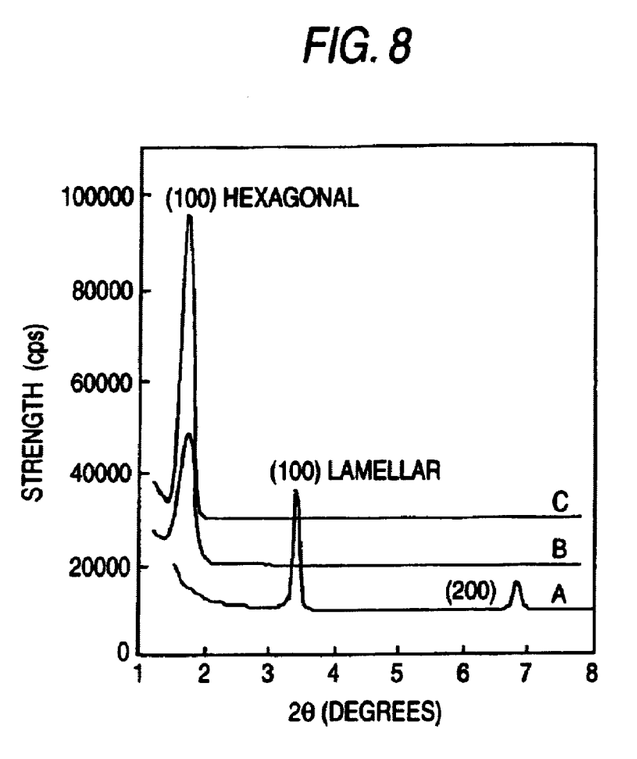
FIG. 8 is a chart showing an X-ray diffraction (XRD) result in the formation of a dielectric thin film (a mesoporous silica thin film) according to the fourth embodiment of the invention.

FIG. 8 shows an X-ray diffraction (XRD) result in the formation of a thin film having a low dielectric constant (a mesoporous silica thin film). An X-ray diffraction pattern is recorded on the Phililps X part MPD using a CuKα ray having a wavelength λ=1.5418 angstrom in a θ=2θ scan mode. A curve A represents a surfactant film obtained before CVD (Chemical Vapor Deposition), a curve B represents a mesoporous silica thin film which is synthesized, and a curve C represents a mesoporous silica thin film which is calcined. As is apparent from a comparison between the curves B and C, a (100) diffraction peak is coincident without a deviation by the calcining, and an excellent orientation is maintained and the structure or a film formed by the CVD is not changed but held.

From this result, according to the method of the embodiment in accordance with the invention, a crosslinking reaction progresses well, and the strength of the structure is enhanced and the structure is maintained without a destruction also in the calcining by the treatment in the TEOS vapor atmosphere. As a result, it can be supposed that the diffraction peaks are coincident with each other and the calcining is completed well without the destruction of the periodic structure.

Figure 9:
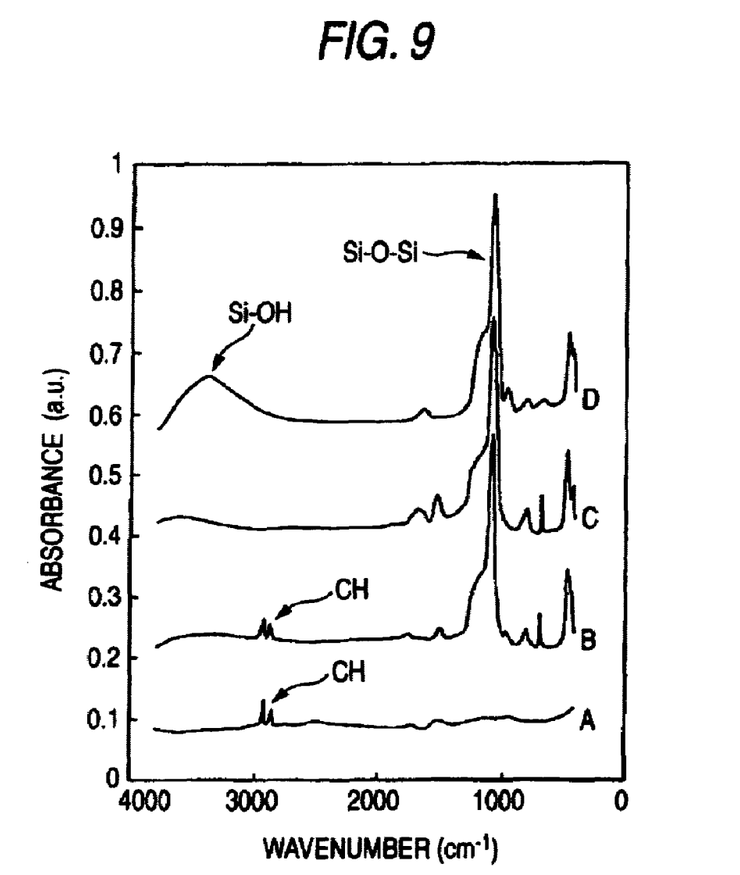
FIG. 9 is a chart showing the Fourier transform infrared spectrum of the mesoporous silica thin film of the dielectric thin film (the mesoporous silica thin film) according to the fourth embodiment of the invention.

FIG. 9 is a chart showing the Fourier transform infrared spectrum of the mesoporous silica thin film analyzed in 4 $cm^{-1}$ on a spectrometer manufactured by SHIMADZU

CORPORATION which is referred to as FTIR-8200PC. A curve A represents a surfactant film having a layer structure, a curve B represents a mesoporous thin film formed by using a TEOS vapor at 135° C., a curve C represents a mesoporous thin film obtained after the calcining, and a curve D represents a mesoporous silica thin film formed by the sol-gel method. The sol-gel film is formed by using water/EtOH/CTAB/TEOS. This is formed on the silicon substrate by a quick vapor deposition method by means of a spin coater. Referring to the mesoporous thin film obtained before and after the calcining, a peak is not present in a wide band at 3500 cm$^{-1}$. Therefore, it is apparent that an Si—OR group on the silica wall of the mesoporous thin film has a very low concentration. Thus, it is clear that the OH group is not incorporated differently from the sol-gel method and a moisture resistance is enhanced.

According to such a structure, the interlayer dielectric film is formed by a thin film having a low dielectric constant comprising a mesoporous silica thin film having a great film strength, a high adhesion to the substrate, a high moisture resistance and a very excellent orientation. Therefore, it is possible to form FRAM which reduces a capacity caused by the interlayer dielectric film, has an excellent switching characteristic and can carry out a high speed operation.

Moreover, a pore is oriented well in parallel with the surface of the substrate. Consequently, a strength is increased and a low dielectric constant is uniformly obtained in a perpendicular direction to the surface of the substrate. In particular, it is possible to employ a closed structure which has no opening portion on a lower electrode to be an upper layer, a wiring and a substrate. Thus, it is possible to obtain a thin film having a low dielectric constant which has an excellent moisture resistance and a high reliability and is effective. Accordingly, the interlayer dielectric film has a long lifetime without a leakage current.

While the TEOS is used as the silica derivative and the substrate having the surfactant formed thereon is exposed to the TEOS vapor atmosphere prior to the calcining in the example, the silica derivative to be used as the vapor atmosphere is not restricted to the TEOS but it is desirable that a silicon alkoxide material such as TMOS (Tetramethoxy Silane) should be used.

Moreover, it is possible to use a silica derivative having the following structural formula in addition to the TEOS, the TMOS or their mixture.

(Chemical Formula 1)

Rn (n=1, 2, 3, 4 . . . ) represents saturated chain hydrocarbons such as CH$_3$ and C$_2$H$_5$, unsaturated chain hydrocarbons, aromatics such as a benzene ring or saturated cyclic hydrocarbons such as cyclohexane, and R1, R2, R3 and R4 hay be identical to or different from each other.

Furthermore, it is also possible to use R1 as the silica derivative to be used in the process in place of "R1-O" in the chemical formula.

It is further desirable that first to third atomic groups in functional groups "R1-O", "R2-O", "R3-O" and "R4-O" should be substituted for "R1", "R2", "R3" and "R4" respectively. An example will be described in the following formula.

(Chemical Formula 2)

By using a silylation reagent as a vapor, thus, it is possible to construct a mesoporous silica film having a very high moisture resistance in addition to characteristics such as a great strength and a high adhesion.

While cation type cetyltrimethyl ammonium bromide (CTAB:C$_{16}$H$_{33}$N$^+$(CH$_3$)$_3$Br$^-$) has been used as the surfactant in the embodiment, this is not restricted but it is apparent that another surfactant may be used.

If an alkali ion such as an Na ion is used as a catalyst, it causes a deterioration for a semiconductor material. For this reason, it is desirable that a cation type surfactant should be used and an acid catalyst should be used as a catalyst. For the acid catalyst, it is also possible to use an inorganic catalyst such as nitric acid (HNO$_3$), sulfuric acid (H$_2$SO$_4$), phosphoric acid (H$_3$PO$_4$) or H$_4$SO$_4$ in addition to HCl. Moreover, it is also possible to use an organic acid catalyst such as carboxylic acid, sulfonic acid, sulfinic acid or phenol.

In addition, it is possible to use a base catalyst which does not contain an alkaline metal element and an alkaline earth metal element, for example, NH$_4$OH and NH$_3$ type elements.

While the water H2O/alcohol mixed solvent has been used as a solvent, moreover it is also possible to use only water or alcohol.

While the oxygen atmosphere has been used as the calcining atmosphere, furthermore, the treatment may be carried out in the air, under reduced pressure, or in a nitrogen atmosphere. By using a foaming gas constituted by a mixed gas of nitrogen and hydrogen, desirably, it is possible to enhance a moisture resistance and to reduce a leakage current.

Moreover, it is possible to properly change the mixing ratio of the surfactant, the silica derivative, the acid catalyst and the solvent.

Furthermore, it is sufficient that the step of exposing the TEOS under saturated vapor pressure at 180° C. is carried out for approximately 1 to 3 hours. In addition, it is also possible to shorten a time by supplying a TEOS vapor from an outside into a vessel, raising a TEOS partial pressure or raising a process temperature. Furthermore, it is also possible to use plasma CVD or reduced pressure CVD. Moreover, the temperature is not restricted to 180° C. but may be 90° C. or less because the exposure to the vapor of the silica derivative is enough. In addition, it is sufficient that an upper limit is the starting temperature (200 to 300° C.) of the thermal decomposition of the surfactant or less.

Figure 10:
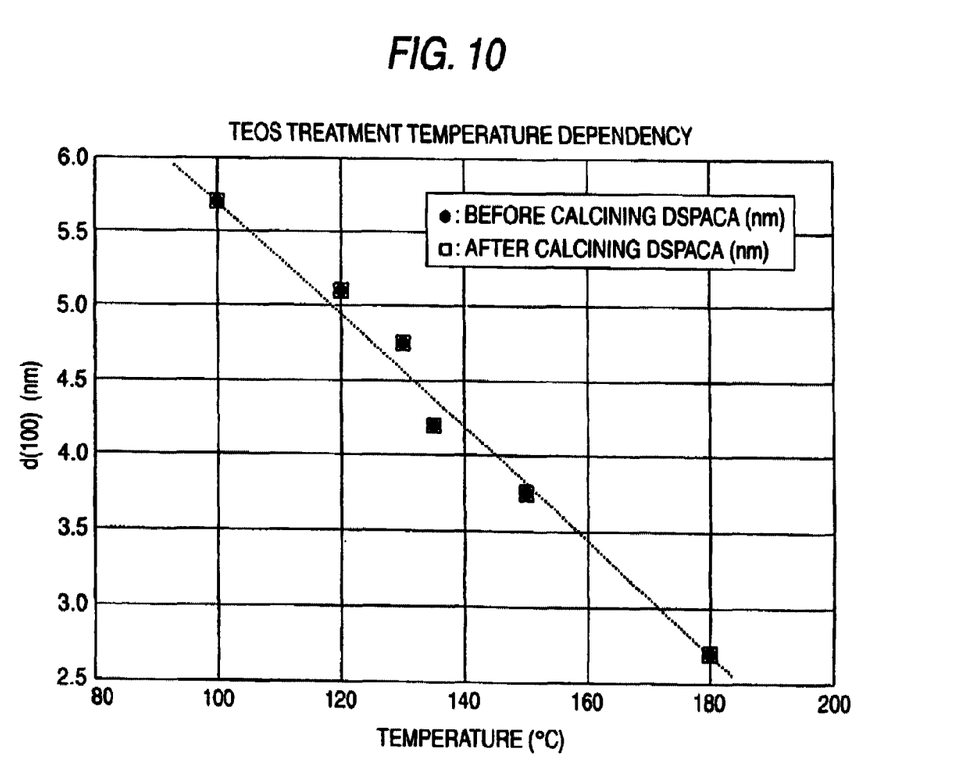
FIG. 10 is a chart showing a relationship between a CVD temperature and a d space in the dielectric thin film (the mesoporous silica thin film) according to the fourth embodiment of the invention.

FIG. 10 shows a result obtained by changing a CVD temperature and measuring a relationship between the CVD temperature and the d-space of a periodic structure. ○ represents a mesoporous thin film obtained immediately after a synthesis and Δ represents a mesoporous thin film obtained after calcining. A 4000 rpm spinner was rotated to form a surfactant film on a silicon substrate by a spin coating method. A CVD thin film was formed by using a TEOS vapor. It was found that the d space over a (100) plane in all samples is not varied before and after the calcining and a structure is not changed.

While the calcining step is carried out for 5 hours at 400° C., moreover, it may be performed for approximately 1 to 5 hours at 300° C. to 500° C. It is desirable that the same step should be carried out at 300° C. to 400° C.

In addition, while the silica derivative film is formed under the saturated vapor pressure of the TEOS prior to the calcining in the embodiment, it is also possible to carry out the calcining in a silica derivative vapor atmosphere such as the TEOS. In this case, a deposit such as oxide is generated on a surface. In that case, it is preferable to remove the deposit by carrying out a surface treatment after the calcining.

Second Embodiment

While the surfactant film has been formed by a spin coating method in the first embodiment, the spin coating method is not restricted but a dip coating method may be used.

Third Embodiment

Figure 6:
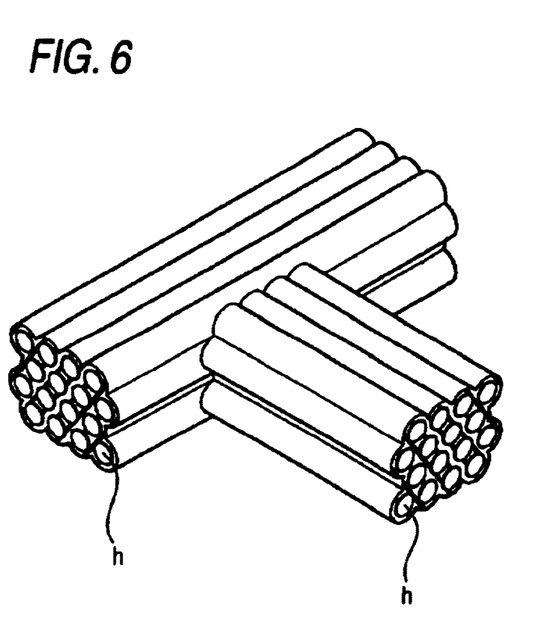
FIG. 6 is an explanatory view showing a dielectric thin film according to a third embodiment of the invention.

While the description has been given to the dielectric thin film having the periodic porous structure including the cylindrical pore oriented in one direction in the embodiments, it is also possible to effectively use an insulating film which includes a plurality of periodic porous structures having a layered pore, that is, a plurality of periodic porous structure domains having a cylindrical pore as shown in FIG. 6 and has the adjacent porous structure domains to each other oriented in different directions from each other. Moreover, it is also possible to farm a pore h to be oriented in the same direction over the whole surface of a substrate.

Fourth Embodiment

Figure 7E:
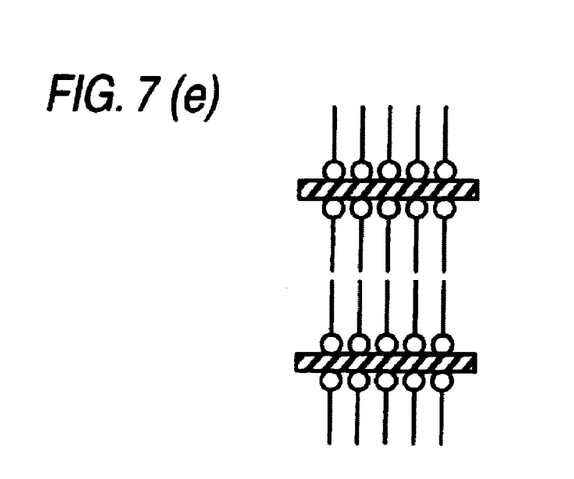
FIG. 7 is an explanatory view showing a process for forming a dielectric thin film according to a fourth embodiment of the invention.
Figure 7F:
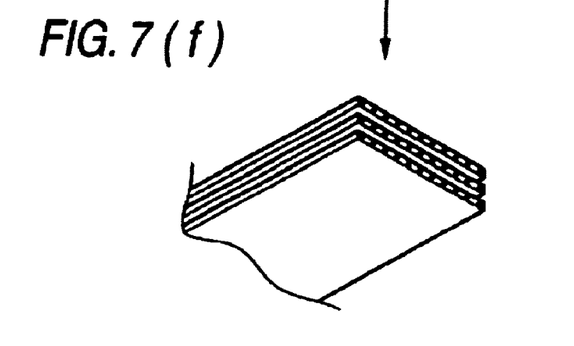

Furthermore, it is also effective to employ a structure in which a pore h is oriented like a layer as shown in FIG. 7(f). Herein, formation is carried out by further increasing the concentration of a surfactant in a precursor solution, and other steps are the same as those in the first embodiment.

When the concentration of the surfactant is further increased in the structure shown in FIG. 4(c), molecules are oriented like a layer as shown in FIG. 7(e), resulting in the formation of an insulating film having a low dielectric constant in which the pore h is oriented like a layer as shown in FIG. 7(f). In this structure, it is possible to more increase a porosity and reduce a dielectric constant as compared with a structure having a cylindrical pore.

In addition, while the interlayer dielectric film or the FRAM has been described in the embodiments, the invention can also be applied to a high speed device, a high frequency device such as a microwave IC, an MFMIS type high integrated ferroelectric memory, a microwave transmission line using a film carrier or a multilayer wiring board including various semiconductor devices using silicon and a device using a compound semiconductor such as HEMT.

Moreover, the insulating film is not restricted but it is possible to apply the invention to various devices other than a semiconductor device such as a fuel cell by utilizing a high degree of pore and a great strength.

While the invention has been described in detail with reference to the specific embodiments, it is apparent to the skilled in the art that various changes and modifications can be made without departing from the spirit and scope of the invention.

The application is based on Japanese Patent Application (No. 2002-57985) filed on Mar. 4th, 2002 and contents thereof are incorporated herein by reference.

INDUSTRIAL APPLICABILITY

As described above, according to the invention, a periodic structure is created by a surfactant and a thin film including a silica derivative is then formed at a vapor deposition step. Therefore, it is possible to form a thin film which has a structure changed with difficulty, is stable and has a great mechanical strength and a high degree of pore.

Moreover, it is possible to easily obtain a thin film having an excellent controllability, a very great mechanical strength and a very high adhesion to a substrate.

What is claimed is:

1. A thin film forming method comprising; a surfactant film forming a step of forming a film including a surfactant on a surface of a substrate;
   a vapor deposition step of causing the substrate to come in contact with a gas whose containing a silica derivative; and
   a step of calcining the substrate having the thin film formed thereon and decomposing and removing the surfactant, the thin film being thus formed.

2. The thin film forming method according to claim 1, wherein the vapor deposition step serves to form a thin film including a silica derivative having a siloxane skeleton and a surfactant and including a silica derivative having a pore arranged periodically.

3. The thin film forming method according to claim 1, wherein the vapor deposition step is executed at a substrate temperature of 180° C. or more.

4. The thin film forming method according to claim 1, wherein the decomposing and removing step includes a step of carrying out calcining at 300 to 400° C.

5. The thin film forming method according to claim 1, further comprising:
   a surfactant film forming step of coating and forming a film including a surfactant on a surface of semiconductor substrate having a desirable device region formed thereon;
   a vapor deposition step of forming a silica derivative thin film by an exposure to a TEOS atmosphere while maintaining the semiconductor substrate at a desirable set temperature; and
   a step of calcining the substrate having the silica derivative thin film formed thereon and decomposing and removing the surfactant, the thin film being thus formed.

6. The thin film forming method according to claim 1, wherein the decomposing and removing step serves to form a thin film having a porosity of 50% or more.

7. The thin film forming method according to claim 1, wherein the decomposing and removing step serves to form an inorganic dielectric thin film having a porosity of 50% or more.

8. The thin film forming method according to claim 1, wherein the decomposing and removing step serves to form, on the surface of the substrate, a thin film including a pore having an orientation.

* * * * *